(12) United States Patent
Keshavan et al.

(10) Patent No.: US 12,378,657 B2
(45) Date of Patent: Aug. 5, 2025

(54) REACTIVE PHASE SPRAY FORMULATION COATINGS

(71) Applicant: General Electric Company, Schenectady, NY (US)

(72) Inventors: Hrishikesh Keshavan, Niskayuna, NY (US); Byron Pritchard, Cincinnati, OH (US); Margeaux Wallace, Niskayuna, NY (US); Ambarish Kulkarni, Niskayuna, NY (US); Mehmet Dede, Cincinnati, OH (US); Bernard Patrick Bewlay, Niskayuna, NY (US)

(73) Assignee: General Electric Company, Evendale, OH (US)

( * ) Notice: Subject to any disclaimer, the term of this patent is extended or adjusted under 35 U.S.C. 154(b) by 11 days.

(21) Appl. No.: 17/574,923

(22) Filed: Jan. 13, 2022

(65) Prior Publication Data

US 2022/0136095 A1 May 5, 2022

Related U.S. Application Data

(62) Division of application No. 15/955,161, filed on Apr. 17, 2018, now abandoned.

(51) Int. Cl.
*C23C 14/06* (2006.01)
*C23C 4/10* (2016.01)
(Continued)

(52) U.S. Cl.
CPC ............... *C23C 14/06* (2013.01); *C23C 4/10* (2013.01); *C23C 4/134* (2016.01); *C23C 14/28* (2013.01)

(58) Field of Classification Search
None
See application file for complete search history.

(56) References Cited

U.S. PATENT DOCUMENTS 6,010,746 A 1/2000 Descoteaux et al.
6,168,833 B1 1/2001 Leushake et al.
(Continued)

FOREIGN PATENT DOCUMENTS

CN 106435446 A 2/2017
EP 1484427 8/2004
(Continued)

OTHER PUBLICATIONS

Bilge et al., CAMS-Resistance Plasma Sprayed Thermal Barrier Coatings Based on Y2O3-Stabalized ZrO2 with Al3+ and Ti4+ Solute Additions, Journal of Thermal Spray Technology, vol. 23, Issue 4, Apr. 2014, pp. 708-715.
(Continued)

*Primary Examiner* — Elizabeth Collister
(74) *Attorney, Agent, or Firm* — Dority & Manning, P.A.

(57) ABSTRACT

A reactive phase spray formulation coating is configured to be disposed on the thermal barrier coating of an article. The reactive phase spray formulation coating comprises a base material and a binder material. The base material has a compliance that is higher than a compliance of the binder material, the binder material has a cohesive strength that is greater than a cohesive strength of the base material, the binder material has an adhesive strength that is greater than an adhesive strength of the base material, and the binder material has a surface area of at least ten square-meters per gram that is greater than a surface area of the base material. The binder material is configured to improve a cohesive strength level, an adhesive strength level, and a compliance of the formulation coating of the thermal barrier coating relative to the formulation coating not including the binder material.

20 Claims, 3 Drawing Sheets

(51) Int. Cl.
*C23C 4/134* (2016.01)
*C23C 14/28* (2006.01)

(56) References Cited

U.S. PATENT DOCUMENTS

| | | |
|---|---|---|
| 6,413,578 B1 | 7/2002 | Stowell et al. |
| 6,465,090 B1 * | 10/2002 | Stowell .................. C04B 41/52 |
| | | 428/323 |
| 6,723,387 B1 | 4/2004 | Kear et al. |
| 6,780,458 B2 | 8/2004 | Seth et al. |
| 6,794,059 B2 | 9/2004 | Shanker |
| 6,827,969 B1 | 12/2004 | Skoog |
| 6,905,728 B1 | 6/2005 | Hu et al. |
| 7,608,552 B2 | 10/2009 | Meyer et al. |
| 8,158,704 B2 | 4/2012 | Jabado et al. |
| 8,168,289 B2 | 5/2012 | Seth et al. |
| 8,356,482 B2 | 1/2013 | Duval et al. |
| 8,470,460 B2 | 6/2013 | Lee |
| 8,993,048 B2 | 3/2015 | Arndt et al. |
| 8,999,514 B2 | 4/2015 | Watwe et al. |
| 9,034,479 B2 | 5/2015 | Nagaraj et al. |
| 9,347,126 B2 | 5/2016 | Pabla et al. |
| 9,347,136 B2 | 5/2016 | Verrier et al. |
| 10,384,978 B2 | 8/2019 | McEvoy et al. |
| 2003/0203224 A1 | 10/2003 | DiConza et al. |
| 2003/0221315 A1 | 12/2003 | Baumann et al. |
| 2004/0134230 A1 | 7/2004 | Kodas et al. |
| 2009/0169752 A1 | 7/2009 | Fu et al. |
| 2009/0252985 A1 | 10/2009 | Nagaraj et al. |
| 2009/0270239 A1 | 10/2009 | Katsuyama et al. |
| 2010/0297432 A1 | 11/2010 | Sherman et al. |
| 2011/0287252 A1 | 11/2011 | Taylor |
| 2013/0095261 A1 | 4/2013 | Ahn et al. |
| 2013/0156958 A1 | 6/2013 | Belov |
| 2015/0079494 A1 | 3/2015 | Lin et al. |
| 2015/0140353 A1 | 5/2015 | Sivaramakrishnan et al. |
| 2018/0050964 A1 | 2/2018 | McEvoy et al. |
| 2019/0106780 A1 | 4/2019 | Hazel et al. |
| 2019/0359528 A1 | 11/2019 | McEvoy et al. |

FOREIGN PATENT DOCUMENTS

| | | |
|---|---|---|
| EP | 3470544 A1 | 4/2019 |
| WO | WO2015/116300 | 8/2015 |

OTHER PUBLICATIONS

Moskovits et al., Sintering of Bimodal Y2O3-Stablized Zirconia Powder Mixtures with a Nanocrystalline Component, Nanostructured Materials, vol. 11, No. 2, 1999, pp. 179-185.

Rai et al., CMAS-Resistant Thermal Barrier Coatings (TBC), International Journal of Applied Ceramic Technology, vol. 7, Issue 6, May 11, 2009, pp. 662-674.

Wu et al., Evaluation of Plasma Sprayed YSZ Thermal Barrier Coatings with the CMAS Deposits Infiltration Using Impedance Spectroscopy, Progress in Natural Science: Materials International, vol. 22, Issue 1, Feb. 2012, pp. 40-47.

* cited by examiner

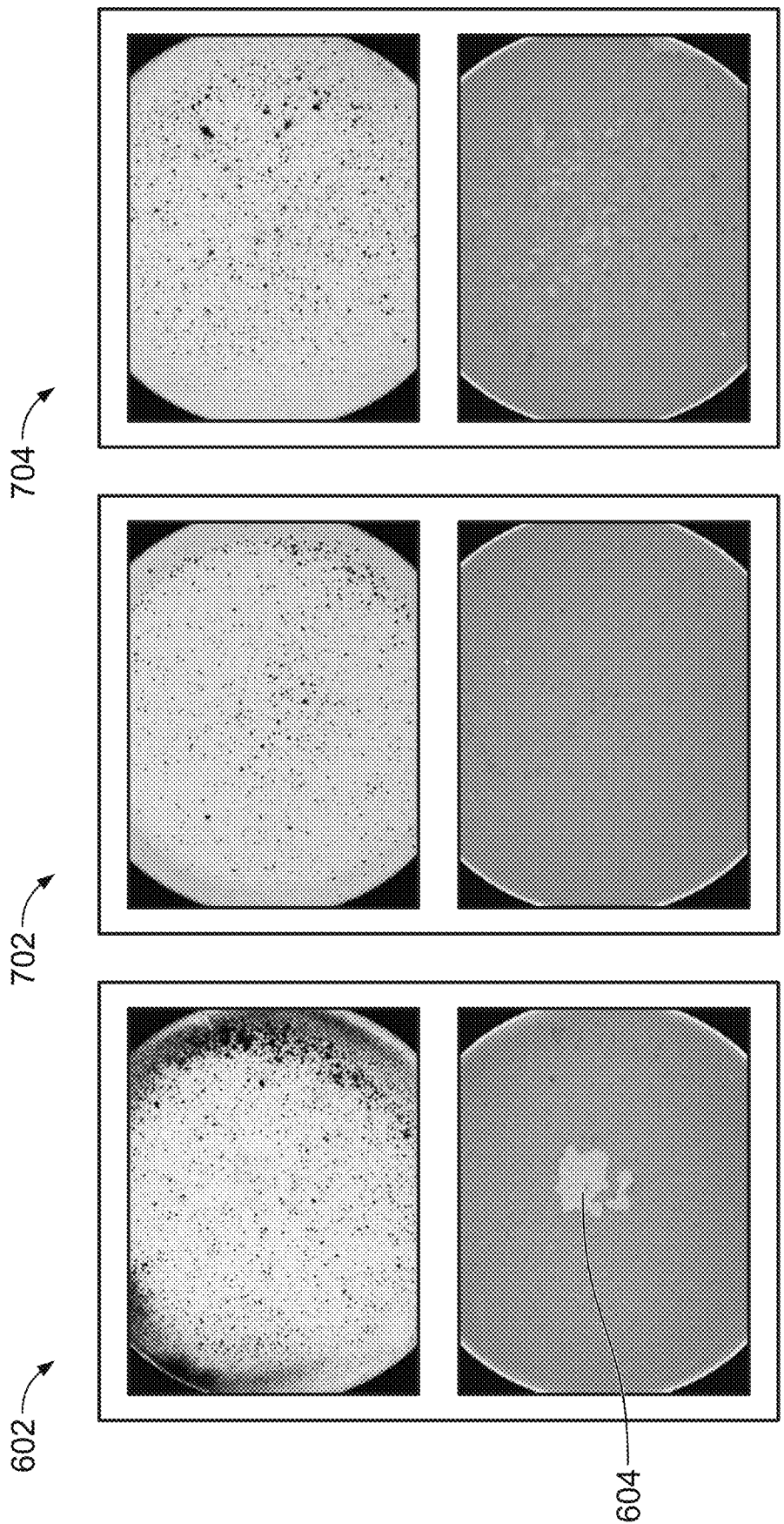

REACTIVE PHASE SPRAY FORMULATION COATINGS

PRIORITY INFORMATION

The present application claims priority to, and is a divisional application of, U.S. patent application Ser. No. 15/955,161 filed on Apr. 17, 2018, which is incorporated herein by reference in its entirety for all purposes.

FIELD

The subject matter described herein relates to reactive coatings.

BACKGROUND

Coatings are extensively used in turbine engines, such as aircraft engines and industrial gas turbines, in order to protect various surfaces of the turbine engine when the turbine engine is operating. One example of a coating is a thermal barrier coating. Coatings may often degrade during service of the turbine engine by spallation, damage, or the like. Spallation may also be caused by the build up of dust and calcia-magnesium-silica (CMAS) deposits on the thermal barrier coating that may infiltrate and compromise the thermal barrier coating.

BRIEF DESCRIPTION

In one embodiment, a reactive phase spray formulation coating is configured to be disposed on the thermal barrier coating of an article. The reactive phase spray formulation coating comprises a base material and a binder material. The base material has a compliance that is higher than a compliance of the binder material, the binder material has a cohesive strength that is greater than a cohesive strength of the base material, the binder material has an adhesive strength that is greater than an adhesive strength of the base material, and the binder material has a surface area of at least ten square-meters per gram that is greater than a surface area of the base material. The binder material is configured to improve a cohesive strength level, an adhesive strength level, and a compliance of the reactive phase spray formulation coating of the thermal barrier coating relative to the reactive phase spray formulation coating not including the binder material.

In one embodiment, a method comprises combining a base material with a binder material to create a reactive phase spray formulation coating. The reactive phase spray formulation coating is configured to be disposed on a thermal barrier coating of an article. The base material has a compliance that is higher than a compliance of the binder material, the binder material has a cohesive strength that is greater than a cohesive strength of the base material, the binder material has an adhesive strength that is greater than an adhesive strength of the base material, and the binder material has a surface area of at least ten square-meters per gram that is greater than a surface area of the base material. The method also comprises depositing the reactive phase spray formulation coating on the thermal barrier coating of the article. The binder material is configured to improve a cohesive strength level, an adhesive strength level, and a compliance of the reactive phase spray formulation coating of the thermal barrier coating relative to the reactive phase spray formulation coating not including the binder material.

In one embodiment, a system comprises a thermal barrier coating disposed on a surface of an article. The thermal barrier coating is configured to reduce an amount of degradation of the article relative to the article not having the thermal barrier coating disposed on the surface. The system also comprises a reactive phase spray formulation coating configured to be disposed on the thermal barrier coating of the article. The reactive phase spray formulation coating comprises a base material and a binder material. The base material has a compliance that is higher than a compliance of the binder material, the binder material has a cohesive strength that is greater than a cohesive strength of the base material, the binder material has an adhesive strength that is greater than an adhesive strength of the base material, and the binder material has a surface area of at least ten square-meters per gram that is greater than a surface area of the base material. The binder material is configured to improve a cohesive strength level, an adhesive strength level, and a compliance of the reactive phase spray formulation coating of the thermal barrier coating relative to the reactive phase spray formulation coating not including the binder material.

BRIEF DESCRIPTION OF THE DRAWINGS

The present inventive subject matter will be better understood from reading the following description of non-limiting embodiments, with reference to the attached drawings, wherein below:

FIG. 6 illustrates post thermal shock inspection images of a thermal barrier coating and a base material applied to an article in accordance with one embodiment;

FIG. 7A illustrates post thermal shock inspection images a thermal barrier coating and a reactive phase spray formulation coating applied to an article in accordance with one embodiment; and FIG. 7B illustrates post thermal shock inspection images of a thermal barrier coating and a reactive phase spray formulation coating applied to an article in accordance with one embodiment.

DETAILED DESCRIPTION

Figure 1:
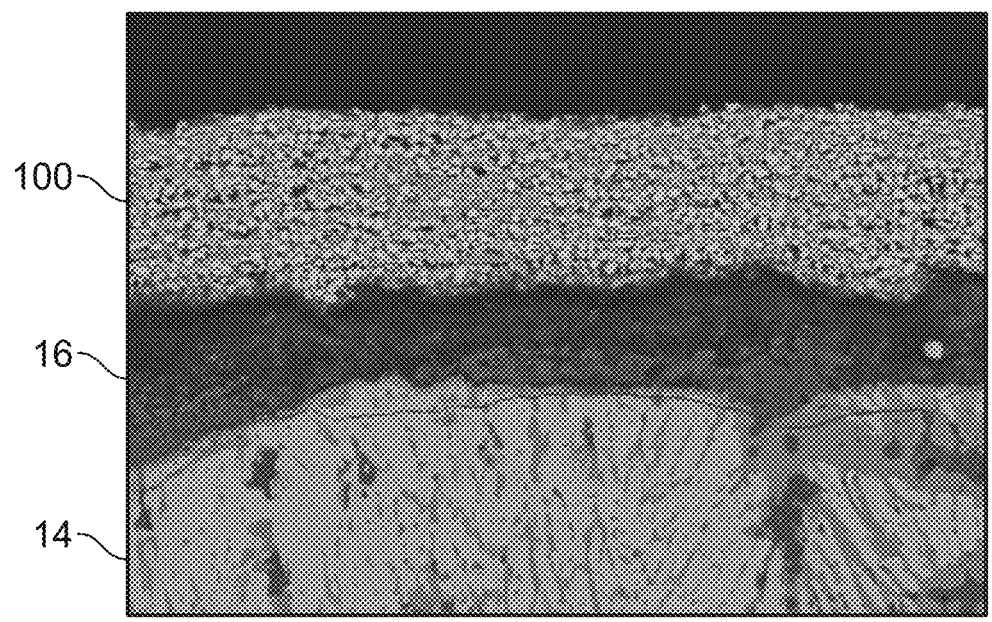
FIG. 1 illustrates a cross-sectional view of a reactive phase spray formulation coating in accordance with one embodiment.

One or more embodiments of the inventive subject matter described herein teaches towards improvements to the life of thermal barrier coatings. Specifically, the embodiments teach the use of reactive phase formulation coatings on the thermal barrier coatings. The reactive phase formulation coating consists of a combination of large ceramic particles (e.g., particles that have a size from 1-10 microns) together with very fine ceramic particles (e.g., particles that have a size less than 1 micron). The very fine ceramic particles function as a binder for the large ceramic particles. The combination of the large and fine ceramic particles can be adjusted to provide preferred combinations of the following properties: adhesive strength, cohesive strength, and compliance.

One or more embodiments of the inventive subject matter described herein relate to reactive phase spray formulation coatings that effectively improve the life of a thermal barrier coating. Dust deposits and/or calcia-magnesium-silica (CMAS) deposits form layers on the thermal barrier coatings during operation of a system, such as a turbine engine. The dust deposits infiltrate the thermal barrier coating and degrade and/or damage the thermal barrier coating during service of the turbine engine. To address one or more of these problems, one embodiment of the subject matter described herein includes a reactive phase spray formulation coating including a base material (e.g., the large ceramic particles) and a binder material (e.g., the fine ceramic particles). The base material has a base compliance that is higher than a binder compliance of the binder material. The binder material has a cohesive strength that is greater than a cohesive strength of the base material. The binder material also has an adhesive strength that is greater than an adhesive strength of the base material. The particles of the binder material also have a surface area of at least ten (10) square-meters per gram (m2/g) that is greater than a surface area of the particles of the base material. The formulation or combination of the base material and the binder material is deposited or sprayed onto the thermal barrier coating of an article (e.g., a surface of a turbine engine) in order to form the reactive phase spray formulation coating on the thermal barrier coating of the article.

The binder material improves a cohesive strength level of the reactive phase spray formulation coating, improves an adhesive strength level of the reactive phase spray formulation coating, and improves a compliance of the reactive phase spray formulation coating of the thermal barrier coating relative to the reactive phase spray formulation coating not including the binder material. At least one technical effect of the subject matter described herein includes improving the life of the thermal barrier coating without removal of the turbine engine from a wing of an aircraft, or in a land-based gas turbine installation, relative to the reactive phase spray formulation coating not including the binder material. Another technical effect of the subject matter described herein includes improving the reduction of component damage, improving the reduction of repair and/or replacement costs, or improving the time between outages of the turbine engine, relative to the reactive phase spray formulation coating not including a binder material. Another technical effect of the subject matter described herein includes improving an adhesive strength level of the reactive phase spray formulation coating to the thermal barrier coating without any thermal treatment or thermal processes.

Figure 2:
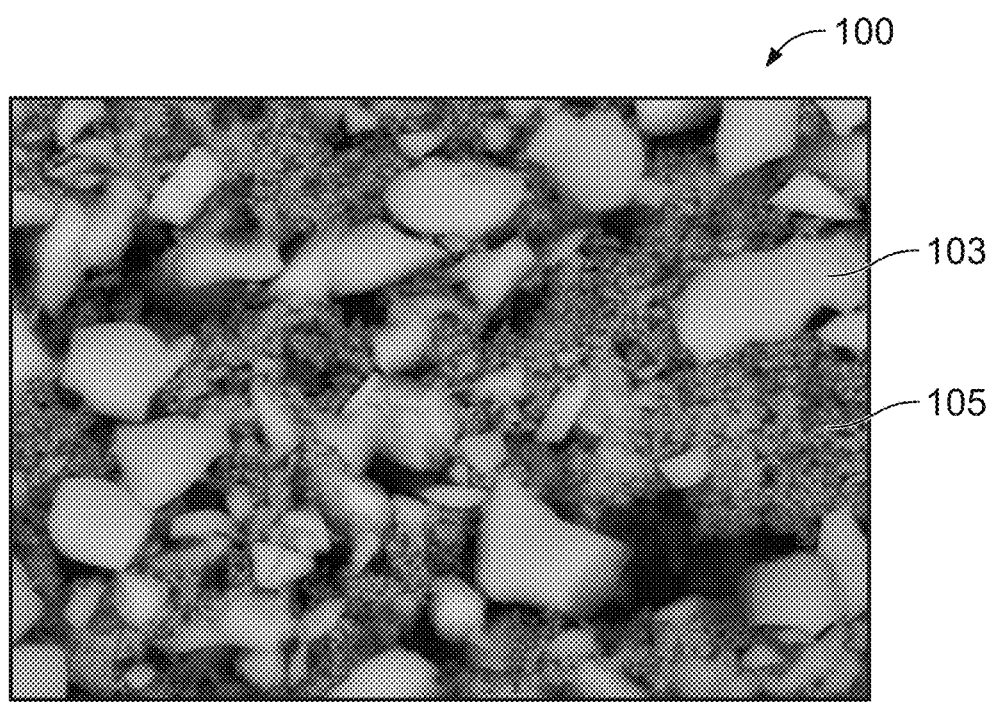
FIG. 2 illustrates a magnified view of the reactive phase spray formulation coating of FIG. 1 in accordance with one embodiment.

FIG. 1 illustrates a cross-sectional view of a reactive phase spray formulation coating 100 in accordance with one embodiment. FIG. 2 illustrates a magnified view of the reactive phase spray formulation coating 100 of FIG. 1 in accordance with one embodiment. The reactive phase spray formulation coating 100 is applied to a thermal barrier coating 14 of an article (not shown). In one embodiment, the article may be a surface of a turbine engine, and the thermal barrier coating 14 may be a ceramic thermal barrier coating, a ceramic coating, or the like, that is applied to one or more surfaces of the turbine engine. The coating 100 may be applied on the thermal barrier coating of a new part (e.g., a new component of a turbine engine), the coating 100 may be applied on the thermal barrier coating of a repaired part (e.g., an existing and/or used component of the turbine engine), may be applied on the repaired part in the field or at a maintenance location, or the like. In one or more embodiments, the thermal barrier coating 14 may be applied by a physical vapor deposition (PVD) method, or the like. Additionally or alternatively, the thermal barrier coating 14 may be deposited onto the article by one or more processes, such as, but not limited to, air plasma sprays (APS), electron beam-physical vapor deposition (EBPVD), directed vapor deposition (DVD), suspension plasma spray (SPS), or the like.

In the illustrated embodiment of FIG. 1, a layer of dust deposits 16 are disposed between the thermal barrier coating 14 and the reactive phase spray formulation coating 100. For example, responsive to the turbine engine operating during a test cycle, operating cycle, service cycle, or the like, dust deposits may collect, form, or the like, on one or more surfaces of the turbine engine on the thermal barrier coating 14. Optionally, a layer of dust deposits 16 may not collect or may not have formed on the thermal barrier coating 14. Additionally or alternatively, a layer of calcia-magnesia-alumina-silica (CMAS) deposits may also collect, form, or the like, on the one or more surfaces of the turbine engine on the thermal barrier coating 14.

The reactive phase spray formulation coating 100 includes a base material 103 that is combined with a binder material 105. In one embodiment, the reactive phase spray formulation coating 100 contains between 1% and 75% of the binder material 105, and the balance is the base material 103. In a preferred embodiment, the reactive phase spray formulation coating 100 contains between 3% and 50% of the binder material 105, and the balance is the base material 103. In an even more preferred embodiment, the reactive phase spray formulation coating 100 contains between 5% and 45% of the binder material 105, and the balance is the base material 103. Optionally, the reactive phase spray formulation coating 100 may contain the base material 103 and/or the binder material 105 with any alternative weight percentage.

In one or more embodiments, the base material 103 may be referred to herein as a base ceramic material. The base material 103 may be an earth oxide, such as, but not limited to, yttrium (Y), gadolinium (Gd), zirconium (Zr), oxygen (O), or the like. The base material 103 reacts with the CMAS in order to form or generate a melting point phases that is greater than a melting point phase of an alternative base material. For example, the reaction between the base material 103 and the CMAS may change the chemistry or chemical composition of the CMAS. In one embodiment, the base material 103 has a particle size of between less than 1 micron and 25 microns. In a preferred embodiment, the base material 103 has a particle size of between and including 1 micron and 10 microns. Optionally, the base material 103 may have an alternative particle size.

In one or more embodiments, the binder material 105 may also be referred to herein as a ceramic binder material, a ceramic powder binder, a ceramic binder, or the like. The binder material 105 has a chemical configuration that is similar to the chemical configuration of the base material 103. For example, the binder material 105 may be an earth oxide, such as, but not limited to, yttrium (Y), gadolinium (Gd), zirconium (Zr), oxygen (O), or the like. In one embodiment, the binder material 105 has a particle size that is between a size greater than 5 nanometers and 1 micron. In a preferred embodiment, the binder material 105 has a particle size that is greater than 5 nanometers and less than 1 micron. Optionally, the binder material 105 may have an alternative particle size. In one or more embodiments, the binder material 105 may have a morphology that is non-spherical, spherical, angular, or the like. In a preferred embodiment, the particles of the binder material 105 are not spherical.

In one embodiment, the binder material 105 has a surface area that is between 1 square-meters per gram (m2/g) and an infinite size. In a more preferred embodiment, the binder material 105 has a surface area that is between 5 m2/g and 10 m2/g. In an even more preferred embodiment, the binder material 105 has a surface area that at least 10 m2/g or greater (e.g., larger). Optionally, the binder material 105 may have an alternative surface area.

The surface area of the binder material 105 is greater than a surface area of the base material 103. Additionally, the binder material 105 has a cohesive strength that is greater than a cohesive strength of the base material 103. In one or more embodiments, the cohesive strength of the base material 103 may also be referred to herein as a base cohesive strength, and the cohesive strength of the binder material 105 may also be referred to herein as a binder cohesive strength. The larger surface area particles of the binder material 105 bond to the other larger diameter particles of the binder material 105. For example, the larger surface area of the particles of the binder material 105 improves a cohesive strength level of the reactive phase spray formulation coating 100 relative to the reactive phase spray formulation coating 100 not including the binder material 105. Additionally, the binder material 105 improves a cohesive strength level of the reactive phase spray formulation coating 100 on the thermal barrier coating 14 after thermal exposure of the reactive phase spray formulation coating 100, relative to the reactive phase spray formulation coating 100 that does not include the binder material 105.

The particle size of the binder material 105 is less than the particle size of the base material 103. Additionally, the binder material 105 has an adhesive strength that the greater than an adhesive strength of the base material 103. For example, the smaller particle size of the binder material 105 improves an adhesive strength level of the reactive phase spray formulation coating 100 relative to the reactive phase spray formulation coating 100 not including the binder material 105. In one or more embodiments, the adhesive strength of the base material 103 may also be referred to herein as a base adhesive strength, and the adhesive strength of the binder material 105 may also be referred to herein as a binder adhesive strength. The smaller particle size and the larger surface area of the binder material 105, relative to the base material 103, improves the adhesion of the reactive phase spray formulation coating 100 to the thermal barrier coating 14 relative to the reactive phase spray formulation coating 100 not including the binder material 105. Additionally, the binder material 105 improves an adhesive strength level of the reactive phase spray formulation coating 100 on the thermal barrier coating 14 after thermal exposure of the reactive phase spray formulation coating 100, relative to the reactive phase spray formulation coating 100 that does not include the binder material 105.

In one embodiment, the inventors found that the binder material 105 unexpectedly improves the adhesive strength level of the reactive phase spray formulation coating 100 to the thermal barrier coating, and improves the cohesive strength level of the reactive phase spray formulation coating 100 without a thermal treatment, thermal process, or the like, relative to the formulation coating 100 that does not include the binder material 105. For example, the large surface energy component of the large surface area of the binder particles (e.g., relative to the small surface area of the base particles) drives a low temperature sintering and/or bonding of the binder particles to adjacent surfaces. The low temperature sintering improves the cohesive strength level of the reactive phase spray formulation coating 100 and improves the adhesive strength level of the reactive phase spray formulation coating 100 to the thermal barrier coating 14 relative to the reactive phase spray formulation coating 100 that does not include the binder material 105. In one or more embodiments, the reactive phase spray formulation coating 100 may be applied, deposited, or the like, onto the thermal barrier coating 14 with a cold and/or non-thermal process such as, but not limited to, a spray process, a slurry process, or the like.

The base material 103 has a chemical configuration that is similar to the chemical configuration of the binder material 105. For example, the base material 103 and the binder material 105 may both have a chemical configuration that includes a Zirconia-yttria formulation. In one embodiment, the base material 103 may have a Zirconia—55% yttria formulation (55YSZ), and the binder material 105 may have a Zirconia—8% yttria formulation (8YSZ), a Zirconia—20% yttria formulation (20YSZ), or any alternative Zirconia-yttria formulation. Optionally, the base material 103 and the binder material 105 may have an alternative chemical formulation comprising one or more of an alpha aluminum oxide formulation, silicone-dioxide, CMAS, strontium aluminum garnet (SAG), gallium alumina perovskite (GAP), gadolinia zirconia (GdZr), or the like.

In one embodiment, the reactive phase spray formulation coating 100 may include the base material 103 that has a chemical configuration of about 70 grams of 55YSZ with a median particle size less that is than 10 microns and a surface area between 1 m2/g and 2 m2/g. The base material 103 may be combined with the binder material 105 having a chemical configuration of about 30 grams of 8YSZ with a median particle size that is less than 1 micron and a surface area that is greater than 15 m2/g. The reactive phase spray formulation coating 100 has a ratio having at least seven parts of the base material 103 to at least three parts of the binder material 105. For example, the reactive phase spray formulation coating 100 may contain about 45% of the binder material 105, with the balance being the base material 103. The reactive phase spray formulation coating 100 that is deposited onto the thermal barrier coating 14 may have a thickness of about 5 microns, about 10 microns, about 12 microns, about 15 microns, or the like. Optionally, the reactive phase spray formulation coating 100 may include a different amount of the base material 103 and/or the binder material 105, the base material 103 and/or the binder material 105 may have an alternative particle size, surface area, chemical configuration, or any alternative combination therein.

In one embodiment, the reactive phase spray formulation coating 100 may include the base material 103 that has a chemical configuration of about 95 grams of 55YSZ with a median particle size less that is than 10 microns and a surface area between 1 m2/g and 2 m2/g. The base material 103 may be combined with the binder material 105 having a chemical configuration of about 5 grams of 8YSZ with a median particle size that is less than 1 micron and a surface area that is greater than 15 m2/g. The reactive phase spray formulation coating 100 has a ratio having at least nineteen parts of the base material 103 to at least one part of the binder material 105. For example, the reactive phase spray formulation coating 100 may contain about 5% of the binder material 105, with the balance being the base material 103. The reactive phase spray formulation coating 100 that is deposited onto the thermal barrier coating 14 may have a thickness of about 5 microns, about 10 microns, about 12 microns, about 15 microns, or the like. Optionally, the reactive phase spray formulation coating 100 may include a different amount of the base material 103 and/or the binder material 105, the base material 103 and/or the binder material 105 may have an alternative particle size, surface area, chemical configuration, or any alternative combination therein.

In one embodiment, the reactive phase spray formulation coating 100 may include the base material 103 that has a chemical configuration of 100 grams of pseudo-boehmite that is calcined in air to form aluminum oxide ($Al_2O_3$) with a surface area that is about 50 m2/g. The base material 103 may be combined with the binder material 105 that has a chemical configuration of about 100 grams of $Al_2O_3$ with a median particle size that is less than 1 micron. The reactive phase spray formulation coating 100 that is deposited onto the thermal barrier coating 14 may have a thickness of about 5 microns, about 10 microns, about 12 microns, about 15 microns, or the like.

The base material 103 has a compliance that is higher than a compliance of the binder material 105. For example, the base material 103 has a modulus of elasticity and a stiffness that is less than a modulus of elasticity and a stiffness of the binder material 105. In one or more embodiments, the compliance of the base material 103 may also be referred to herein as a base compliance, and the compliance of the binder material 105 may also be referred to herein as a binder compliance. The reactive phase spray formulation coating 100 remains substantially compliant responsive to deposition of the formulation coating 100 onto the thermal barrier coating 14, thermal exposure responsive to operation of the turbine engine, and a reaction with the dust deposits 16 deposited on the thermal barrier coating 14. In one or more embodiments, the reactive phase spray formulation coating 100 has an in-plane modulus of elasticity less than 100 gigapascal (GPa). In a preferred embodiment, the reactive phase spray formulation coating 100 has an in-plane modulus of elasticity less than 80 GPa. In an even more preferred embodiment, the reactive phase spray formulation coating 100 has an in-plane modulus of elasticity less than 60 GPa. For example, a reactive phase spray formulation coating 100 with an in-plane modulus of elasticity that is greater than 60 GPa may cause spallation of the reactive phase spray formulation coating 100 responsive to a reaction with the dust deposits 16 during thermal cycling of the turbine engine.

The reactive phase spray formulation coating 100, that is created or formed by the reaction of the larger particle size of the base material (e.g., greater than 1 micron) with the binder material 105 in the formulation coating 100, and the dust deposits 16 that are incident on the thermal barrier coating 14, need to be compliant such that upon thermal cycling of the turbine engine, the cyclic strains do not generate spallation of the formulation coating 100. Responsive to thermal exposure of the spray formulation coating 100 by operation of the turbine engine, the larger base material 103 particles are affected less than the smaller binder material 105 particles that experience morphological changes, coarsening, or the like, during the thermal cycling. The compliance of the base material 103 substantially maintains the in-plane modulus of elasticity of the reactive phase spray formulation coating 100 at less than 60 GPa.

Figure 3:
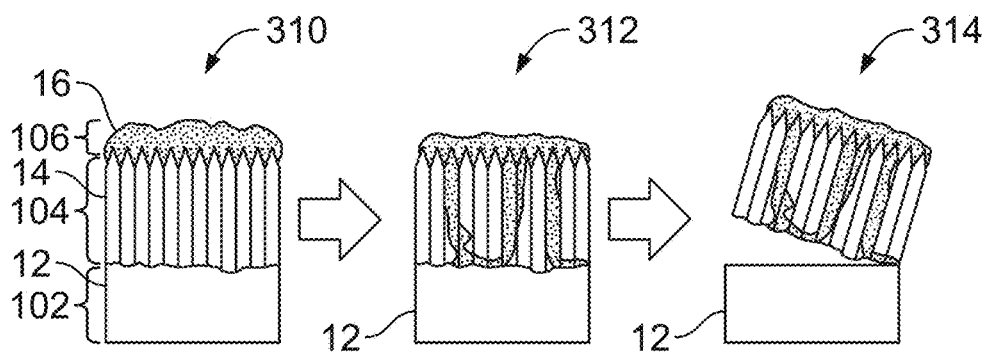
FIG. 3 illustrates a known reaction of a thermal barrier coating applied to an article.

FIG. 3 illustrates a known reaction of the thermal barrier coating 14 applied to an article 12. In one or more embodiments, the article 12 may be a surface of a turbine engine, a surface of one or more components of the turbine engine such as a turbine blade or airfoil, or the like. The thermal barrier coating 14 has a coating thickness 104 that is deposited onto the article 12 and extends a distance away from the article 12. At 310, a layer of the dust deposits 16 is disposed on the thermal barrier coating 14. For example, responsive to the turbine engine operating during a test cycle, operating cycle, or the like, dust deposits may collect, form, or the like, on one or more surfaces of the turbine engine on the barrier coating 14.

At 320, the dust deposits 16 and/or CMAS deposits infiltrate the thermal barrier coating 14 during service or operation of the turbine engine. For example, the thermal barrier coating 14 begins to degrade and the dust deposits 16 begin to move into and/or through thermal barrier coating 14. The dust deposits 16 that infiltrate the thermal barrier coating 14 compromise the stability of the thermal barrier coating 14. At 314, the thermal barrier coating 14 begins to spall responsive to the dust deposits 16 and/or CMAS build up and infiltration. The spallation of the thermal barrier coating 14 exposes the article 12 at the location of the spallation such that the article 12 may be damaged at the location of the spallation.

Figure 4:
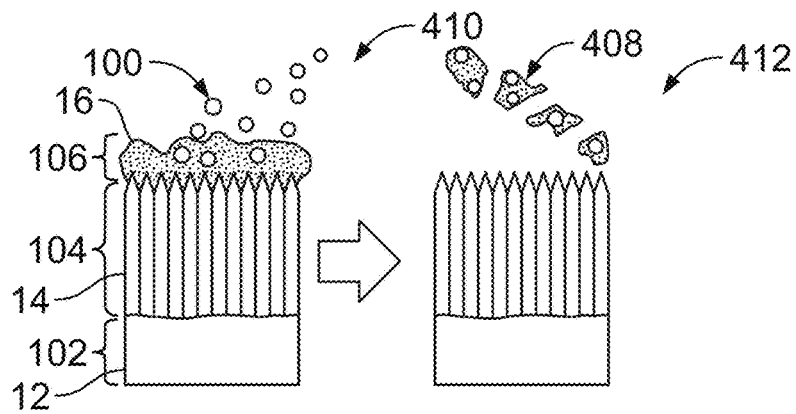
FIG. 4 illustrates a reaction of a thermal barrier coating and a reactive phase spray formulation coating applied to an article in accordance with one embodiment.

Alternatively, FIG. 4 illustrates a reaction of the thermal barrier coating 14 and the reactive phase spray formulation coating 100 applied to the article 12 in accordance with one embodiment. In the illustrated embodiment at 410, the reactive phase spray formulation coating 100 is applied to, deposited onto, sprayed onto, or the like, the layer of the dust deposits 16 that have formed on the thermal barrier coating 14. Optionally, the reactive phase spray formulation coating 100 may be applied directly onto the thermal barrier coating 14. At 412, during or responsive to the turbine engine operating during a test cycle, operating cycle, or the like, the reactive phase spray formulation coating 100 reacts with the dust deposits 16 and/or CMAS deposits. The reaction between the formulation coating 100 and the CMAS deposits raises the fusion temperature of the CMAS deposits. As a result of the reaction between the formulation coating 100 and the dust deposits 16, the formulation coating 100 and the dust deposits 16 flake off or fall off of the thermal barrier coating 14 and does not infiltrate the thermal barrier coating 14. The reactive phase spray formulation coating 100 reacting with the dust deposits 16 reduces an amount of spalling of the thermal barrier coating 14 relative to the reactive phase spray formulation coating 100 not being disposed on the thermal barrier coating 14.

Figure 5:
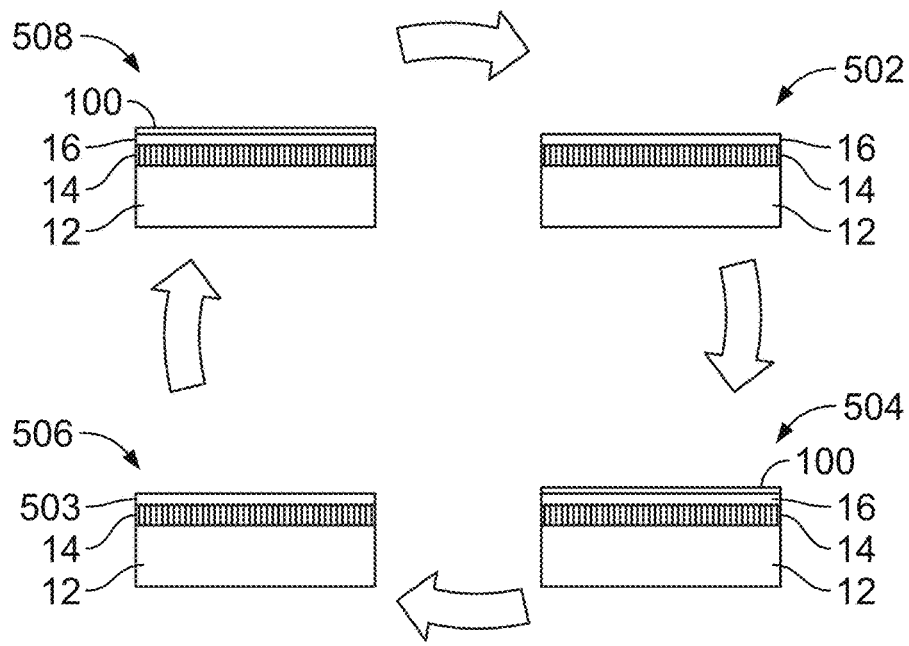
FIG. 5 illustrates a cyclical process flow of applying a reactive phase spray formulation coating to an article in accordance with one embodiment.

FIG. 5 illustrates a cyclical process flow of applying the reactive phase spray formulation coating 100 to the article 12 in accordance with one embodiment. At 502, the article 12 includes a layer of the thermal barrier coating 14 applied to the article 12. A layer of the dust deposits 16 forms on the thermal barrier coating 14 as the turbine engine operates. At 504, the reactive phase spray formulation coating 100 is applied, deposited, or the like, to the thermal barrier coating 14 and the dust deposits 16. At 506, responsive to operation of the turbine engine, the reactive phase spray formulation coating 100 reacts with the dust deposits 16. For example, the reactive phase spray formulation coating 100 consumes, infiltrates, or the like, the dust deposits 16. As the temperature increases due to the operation of the turbine engine, the reaction between the formulation coating 100 and the dust deposits 16 forms or creates a layer of reacted dust 503 that flake off or fall off of the thermal barrier coating 14. The reacted dust 503 that flakes off or falls off of the thermal barrier coating 14 exposes the thermal barrier coating 14. For example, as the turbine engine continues to operate, a second, different layer of dust deposits 16 or CMAS deposits may form on the thermal barrier coating 14.

At 508, a second, different layer of the reactive phase spray formulation coating 100 may be applied to the layer of the dust deposits 16 that have formed on the thermal barrier coating 14. The second layer of the reactive phase spray formulation coating 100 may be applied to and adhere to the thermal barrier coating 14 without dissembling the turbine engine, without a thermal treatment or process, may be spot-sprayed to a specific location of the thermal barrier coating 14, or the like. For example, the small surface area of the binder material 105 relative to the surface area of the base material 103 improves the adhesive strength level of the reactive phase spray formulation coating 100 to the thermal barrier coating 14 without any thermal treatment or thermal process. After exposure to plural cyclical process flows (as illustrated in FIG. 5), the inventors unexpectedly found that the thermal barrier coating 14, with the reactive phase spray formulation coating 100 deposited onto the thermal barrier coating 14, had an improved life benefit of at least 50% relative to the thermal barrier coating 14 without the reactive phase spray formulation coating 100.

FIG. 6 illustrates post thermal shock inspection images of the thermal barrier coating 14 and the base material 103 applied to the article 12 in accordance with one embodiment. The base material 103 is deposited on to or applied to the thermal barrier coating 14 disposed on the article 12. For example, a substantially 12-micron thick layer of the base material 103 having a chemical configuration of 55SYZ is applied to the thermal barrier coating 14 at an ambient temperature. The article 12, thermal barrier coating 14, and base material 103 are subjected to plural thermal shocks that may be substantially similar to ten take-off thermal shock cycles of the turbine engine. The images 602 illustrate the post thermal shock inspection images. As illustrated at 604, thermal shock driven spallation of the thermal barrier coating 14 has occurred during the thermal shock heat treatment. For example, the base material 103 (e.g., that is not combined with the binder material 105) that is applied to the thermal barrier coating 14 fails to protect the thermal barrier coating 14 from spallation.

Alternatively, FIG. 7A illustrates post thermal shock inspection images of the thermal barrier coating 14 and the reactive phase spray formulation coating 100 applied to the article 12 in accordance with one embodiment. The base material 103 having a chemical configuration of 55SYZ is combined with the binder material 105 having a chemical configuration of 10SYZ to form the reactive phase spray formulation coating 100. A substantially 12-micron thick layer of the formulation coating 100 is applied to the thermal barrier coating 14 at an ambient temperature. The article 12, thermal barrier coating 14, and reactive phase spray formulation coating 100 are subjected to plural thermal shocks that may be substantially similar to ten take-off thermal shock cycles of the turbine engine. The images 702 illustrate the post thermal shock inspection images. As illustrated in the images 702, substantially no thermal shock driven spallation of the thermal barrier coating 14 has occurred during the thermal shock heat treatment. For example, the reactive phase spray formulation coating 100 including the binder material 105 combined with the base material 103 reduces an amount of spalling of the thermal barrier coating 14 relative to the reactive phase spray formulation coating 100 that does not include the binder material 105, as illustrated in FIG. 6. The inventors found that an embodiment of the reactive phase spray formulation coating having the base material and the binder material with one or more qualities and characteristics described herein, increased or improved a cohesive strength level, an adhesive strength level, and a compliance of the reactive phase spray formulation coating that was unexpected.

FIG. 7B illustrates post thermal shock inspection images of the thermal barrier coating 14 and the reactive phase spray formulation coating 100 applied to the article 12 in accordance with one embodiment. The base material 103 having a chemical configuration of 55SYZ is combined with the binder material 105 having a chemical configuration of 10SYZ to form the reactive phase spray formulation coating 100. A substantially 12-micron thick layer of the formulation coating 100 is applied to the thermal barrier coating 14 at a temperature of about 1600° F. The article 12, thermal barrier coating 14, and reactive phase spray formulation coating 100 are subjected to plural thermal shocks that may be substantially similar to ten take-off thermal shock cycles of the turbine engine. The images 702 illustrate the post thermal shock inspection images. As illustrated in the images 702, a minimal amount of spalling of the thermal barrier coating 14 has occurred during the thermal shock heat treatment relative to the spalling of the thermal barrier coating 14 of the images 602. For example, the reactive phase spray formulation coating 100, including the binder material 105 combined with the base material 103, reduces an amount of spalling of the thermal barrier coating 14 relative to the reactive phase spray formulation coating 100 that does not include the binder material 105. The inventors found that an embodiment of the reactive phase spray formulation coating having the base material and the binder material with one or more qualities and characteristics described herein improves on-wing life and overall performance of the components or surfaces with thermal barrier coatings 14 that was unexpected.

In one or more embodiments, the coating 100 may be applied on the thermal barrier coating of a new part (e.g., a new component of a turbine engine), the coating 100 may be applied on the thermal barrier coating of a repaired part (e.g., an existing and/or used component of the turbine engine), may be applied on the new and/or repaired part in the field or at a maintenance location, or the like. For example, the coating 100 having a first formulation may be applied to a new part, and the coating 100 having a different, second formulation may be applied to an existing part in order to repair or restore the thermal barrier coating of the existing part. The first formulation may have a chemical composition that is different than a chemical composition of the second formulation such that the second formulation is tailored or specifically configured to restore the thermal barrier coating of the existing part.

In one embodiment of the subject matter described herein, a reactive phase spray formulation coating is configured to be disposed on the thermal barrier coating of an article. The reactive phase spray formulation coating comprises a base material and a binder material. The base material has a compliance that is higher than a compliance of the binder material, the binder material has a cohesive strength that is greater than a cohesive strength of the base material, the binder material has an adhesive strength that is greater than an adhesive strength of the base material, and the binder material has a surface area of at least ten square-meters per gram that is greater than a surface area of the base material. The binder material is configured to improve a cohesive strength level, an adhesive strength level, and a compliance of the reactive phase spray formulation coating of the thermal barrier coating relative to the reactive phase spray formulation coating not including the binder material.

Optionally, the reactive phase spray formulation coating is configured to react with dust deposits on the thermal barrier coating.

Optionally, the reactive phase spray formulation coating is configured to reduce an amount of spalling of the thermal barrier coating relative to the reactive phase spray formulation coating not being disposed on the thermal barrier coating.

Optionally, the reactive phase spray formulation coating is configured to be deposited on the thermal barrier coating in a non-thermal process.

Optionally, the binder material has a particle size that is less than one micron, and the base material has a particle size between one micron and ten microns.

Optionally, the base material has a chemical configuration that is common to a chemical configuration of the binder material.

Optionally, the article is a surface of a turbine assembly.

Optionally, reactive phase spray formulation coating has a ratio comprising of at least seven parts of the base material to at least three parts of the binder material.

Optionally, the reactive phase spray formulation coating has a ratio comprising of at least nineteen parts of the base material to at least one part of the binder material.

Optionally, the base material includes one or more parts of zirconium, oxygen, or yttrium.

Optionally, the binder material includes one or more parts of zirconium, oxygen, or yttrium.

Optionally, the reactive phase spray formulation coating deposited on the thermal barrier coating has a thickness of at least ten microns.

In one embodiment of the subject matter described herein, a method comprises combining a base material with a binder material to create a reactive phase spray formulation coating. The reactive phase spray formulation coating is configured to be disposed on a thermal barrier coating of an article. The base material has a compliance that is higher than a compliance of the binder material, the binder material has a cohesive strength that is greater than a cohesive strength of the base material, the binder material has an adhesive strength that is greater than an adhesive strength of the base material, and the binder material has a surface area of at least ten square-meters per gram that is greater than a surface area of the base material. The method also comprises depositing the reactive phase spray formulation coating on the thermal barrier coating of the article. The binder material is configured to improve a cohesive strength level, an adhesive strength level, and a compliance of the reactive phase spray formulation coating of the thermal barrier coating relative to the reactive phase spray formulation coating not including the binder material.

Optionally, the reactive phase spray formulation coating is configured to react with dust deposits on the thermal barrier coating.

Optionally, the reactive phase spray formulation coating is configured to reduce an amount of spalling of the thermal barrier coating relative to the reactive phase spray formulation coating not being disposed on the thermal barrier coating.

Optionally, the reactive phase spray formulation coating is configured to be deposited on the thermal barrier coating in a non-thermal process.

Optionally, the binder material has a particle size that is less than one micron, and the base material has a particle size between one micron and ten microns.

Optionally, the base material has a chemical configuration that is common to a chemical configuration of the binder material.

Optionally, the article is a surface of a turbine assembly.

Optionally, reactive phase spray formulation coating has a ratio comprising of at least seven parts of the base material to at least three parts of the binder material.

Optionally, the reactive phase spray formulation coating has a ratio comprising of at least nineteen parts of the base material to at least one part of the binder material.

Optionally, the base material includes one or more parts of zirconium, oxygen, or yttrium.

Optionally, the binder material includes one or more parts of zirconium, oxygen, or yttrium.

Optionally, the reactive phase spray formulation coating deposited on the thermal barrier coating has a thickness of at least ten microns.

In one embodiment of the subject matter described herein, a system comprises a thermal barrier coating disposed on a surface of an article. The thermal barrier coating is configured to reduce an amount of degradation of the article relative to the article not having the thermal barrier coating disposed on the surface. The system also comprises a reactive phase spray formulation coating configured to be disposed on the thermal barrier coating of the article. The reactive phase spray formulation coating comprises a base material and a binder material. The base material has a compliance that is higher than a compliance of the binder material, the binder material has a cohesive strength that is greater than a cohesive strength of the base material, the binder material has an adhesive strength that is greater than an adhesive strength of the base material, and the binder material has a surface area of at least ten square-meters per gram that is greater than a surface area of the base material. The binder material is configured to improve a cohesive strength level, an adhesive strength level, and a compliance of the reactive phase spray formulation coating of the thermal barrier coating relative to the reactive phase spray formulation coating not including the binder material.

As used herein, an element or step recited in the singular and proceeded with the word "a" or "an" should be understood as not excluding plural of said elements or steps, unless such exclusion is explicitly stated. Furthermore, references to "one embodiment" of the presently described subject matter are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the subject matter set forth herein without departing from its scope. While the dimensions and types of materials described herein are intended to define the parameters of the disclosed subject matter, they are by no means limiting and are exemplary embodiments. Many other embodiments will be apparent to those of skill in the art upon reviewing the above description. The scope of the subject matter described herein should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

This written description uses examples to disclose several embodiments of the subject matter set forth herein, including the best mode, and also to enable a person of ordinary skill in the art to practice the embodiments of disclosed subject matter, including making and using the devices or systems and performing the methods. The patentable scope of the subject matter described herein is defined by the claims, and may include other examples that occur to those of ordinary skill in the art. Such other examples are intended to be within the scope of the claims if they have structural elements that do not differ from the literal language of the claims, or if they include equivalent structural elements with insubstantial differences from the literal languages of the claims.

What is claimed is:

1. A method comprising:
combining a base material with a binder material to create a reactive phase spray formulation coating containing between 5% and 45% of the binder material and a balance of the base material, the reactive phase spray formulation coating configured to be deposited on a thermal barrier coating of an article to define an external surface thereon and the reactive phase spray formulation coating having an in-plane modulus of elasticity that is less than 60 GPa, wherein the binder material has a particle size that is less than one micron, and wherein the base material has a particle size between one micron and ten microns, wherein the base material consists of zirconium oxide and yttrium oxide, wherein the binder material consists of zirconium oxide and yttrium oxide,
wherein the base material has a modulus of elasticity that is less than a modulus of elasticity of the binder material,
wherein the binder material has a cohesive strength that is greater than a cohesive strength of the base material,
wherein the binder material has an adhesive strength that is greater than an adhesive strength of the base material,
wherein the binder material has a surface area of at least ten square meters per gram that is greater than a surface area of the base material; and
depositing the reactive phase spray formulation coating on the thermal barrier coating of the article.

2. The method of claim 1, wherein the reactive phase spray formulation coating is configured to react with dust deposits on the thermal barrier coating.

3. The method of claim 1, wherein the reactive phase spray formulation coating is configured to reduce an amount of spalling of the thermal barrier coating relative to the reactive phase spray formulation coating not being disposed on the thermal barrier coating.

4. The method of claim 1, further comprising depositing the reactive phase spray formulation coating on the thermal barrier coating in a non-thermal process.

5. The method of claim 1, wherein the binder material has a particle size that is greater than 5 nanometers and less than one micron, and wherein the base material has a particle size that is greater than one micron to ten microns.

6. The method of claim 1, wherein the reactive phase spray formulation coating has a ratio comprising of at least seven parts of the base material to at least three parts of the binder material.

7. The method of claim 1, wherein the reactive phase spray formulation coating has a weight ratio comprising of at least nineteen parts of the base material to at least one part of the binder material.

8. The method of claim 1, wherein the reactive phase spray formulation coating deposited on the thermal barrier coating has a thickness of at least ten microns.

9. The method of claim 1, wherein the dust deposits form a layer of calcia-magnesia-alumina-silica (CMAS) deposits.

10. The method of claim 9, wherein the reactive phase spray formulation coating reacts with the CMAS deposits to change a chemical composition of the CMAS deposits.

11. A coating system comprising:
a thermal barrier coating disposed on a surface of an article, the thermal barrier coating configured to reduce an amount of degradation of the article relative to the article not having the thermal barrier coating disposed on the surface; and
a reactive phase spray formulation coating on the thermal barrier coating of the article to define an external surface of the coating system, the reactive phase spray formulation coating comprising between 5 wt % and 45 wt % of a binder material and a balance of a base material, wherein the reactive phase spray formulation coating has an in-plane modulus of elasticity that is less than 60 GPa, wherein the binder material has a particle size that is less than one micron, the binder material consisting of a zirconium oxide, a gadolinium oxide, of an yttrium oxide, or a combination thereof, and wherein the base material has a particle size between one micron and ten microns, the base material consisting of a zirconium oxide, a gadolinium oxide, an yttrium oxide, or a combination thereof,
wherein the base material has a modulus of elasticity that is less than a modulus of elasticity of the binder material,
wherein the binder material has a cohesive strength that is greater than a cohesive strength of the base material,
wherein the binder material has an adhesive strength that is greater than an adhesive strength of the base material,
wherein the binder material has a surface area of at least ten square-meters per gram that is greater than a surface area of the base material.

12. The coating system of claim 11, wherein the reactive phase spray formulation coating is configured to react with dust deposits on the thermal barrier coating.

13. The coating system of claim 12, wherein the dust deposits form a layer of calcia-magnesia-alumina-silica (CMAS) deposits.

14. The coating system of claim 13, wherein the reactive phase spray formulation coating reacts with the CMAS deposits to change a chemical composition of the CMAS deposits.

15. The coating system of claim 14, wherein the reactive phase spray formulation coating reacts with the CMAS deposits to form a melting point phase that is greater than a melting point phase of an alternative base material comprising an alpha aluminum oxide formulation, silicon dioxide, CMAS, strontium aluminum garnet (SAG), gallium alumina perovskite (GAP, gadolinia zirconia (GdZr), or a combination thereof.

16. The coating system of claim 11, wherein the binder material has a particle size that is greater than 5 nanometers and less than one micron, and wherein the base material has a particle size that is greater than one micron to ten microns.

17. The coating system of claim 11, wherein the reactive phase spray formulation coating has a weight ratio comprising at least seven parts of the base material to at least three parts of the binder material.

18. The coating system of claim 11, wherein the reactive phase spray formulation coating deposited on the thermal barrier coating has a thickness of at least ten microns.

19. The coating system of claim 11, wherein the base material consists of yttrium oxide and zirconium oxide, and the binder material consists of zirconium oxide and yttrium oxide.

20. The coating system of claim 11, wherein the base material consists of 55% by weight yttrium oxide and zirconium oxide, and the binder material consists of zirconium oxide and 8% by weight yttrium oxide, zirconium oxide and 20% by weight yttrium oxide, or a combination of a zirconia-yttria formulation.

\* \* \* \* \*